(12) United States Patent
Chapman (10) Patent No.: US 6,946,940 B2
(45) Date of Patent: Sep. 20, 2005

(54) PERMANENT MAGNET AND SHIM DESIGN

(75) Inventor: Barry Leonard Walter Chapman, Beeston (GB)

(73) Assignee: BTG International Limited, London (GB)

( * ) Notice: Subject to any disclaimer, the term of this patent is extended or adjusted under 35 U.S.C. 154(b) by 139 days.

(21) Appl. No.: 10/806,386

(22) Filed: Mar. 23, 2004

(65) Prior Publication Data

US 2004/0183636 A1 Sep. 23, 2004

Related U.S. Application Data

(63) Continuation of application No. 10/089,435, filed on Mar. 29, 2002, now abandoned, which is a continuation of application No. PCT/GB00/03905, filed on Oct. 11, 2000.

(51) Int. Cl.$^7$ ................................................ H01F 7/00
(52) U.S. Cl. ................................ 335/306; 335/301
(58) Field of Search ........................... 335/296–306; 324/318–320

(56) References Cited

U.S. PATENT DOCUMENTS

| | | | |
|---|---|---|---|
| 4,853,663 A | | 8/1989 | Vermilyea .................... 335/301 |
| 5,055,812 A | * | 10/1991 | Abele et al. ................ 335/210 |
| 5,168,232 A | | 12/1992 | Glover et al. ............... 324/320 |
| 5,266,913 A | | 11/1993 | Chapman .................... 335/216 |
| 5,351,006 A | | 9/1994 | Sumanaweera et al. ..... 324/309 |
| 5,532,597 A | | 7/1996 | McGinley et al. .......... 324/319 |
| 5,656,250 A | * | 8/1997 | Tanaka et al. .............. 423/335 |
| 6,294,972 B1 | | 9/2001 | Jesmanowicz et al. ...... 335/301 |

FOREIGN PATENT DOCUMENTS

| | | |
|---|---|---|
| EP | 0467437 | 1/1992 |
| WO | WO 93/04493 | 3/1993 |

OTHER PUBLICATIONS

M.G. Abele, et al; "Hybrid pole pieces for permanent magnets"; Journal of Applied Physics, vol. 79, 1996, pp. 5199–5201.

P. Konzbul, et al; "Shim coils for NMR 1–16 and MRI solenoid magnets"; Measurement Science and Technology, vol. 6, 1995, pp. 1116–1123.

M.G. Abele, et al; "Compensation of non–uniform magnetic properties of components of a yokeless permanent magnet"; IEEE Transactions on Magnetics, vol. 25, No. 5, Sep. 1989, pp. 3904–3906.

* cited by examiner

Primary Examiner—Ramon M. Barrera
(74) Attorney, Agent, or Firm—Nixon & Vanderhye

(57) ABSTRACT

A general method for the design of structures composed of permanent magnetic material for producing and modifying magnetic fields. The method employs a finite set of permissible spatial harmonic modes upon a surface. In particular, it has applications where the structures are finite and open, for which an exact solution is not possible. The method determines an optimum distribution based upon a least squares minimization of the difference between the achievable and desired field within a Region Of Interest (ROI). The method also has application in passively improving the homogeneity of existing magnetic fields (shimming) by distributing magnetic materials in the vicinity of the ROI.

16 Claims, 9 Drawing Sheets

Bz versus Distance

Fig.7.

FT of Bz versus Distance

Fig.8.

FT of Bz versus Distance

Fig.9.

Axial magnetization amplitude versus distance

Permanent Magnet Uniform Field

Fig. 13.

Permanent Magnet Uniform Field

PERMANENT MAGNET AND SHIM DESIGN

This application is a continuation PCT/GB00/03905 filed Oct. 11, 2000, which is a continuation of application Ser. No. 10/089,435, filed Mar. 29, 2002, now abandoned, the entire content of which is hereby incorporated by reference in this application.

FIELD OF THE INVENTION

This invention relates to the design of permanent magnetic structures for generating a specific magnetic field in a Region Of Interest (ROI) or modifying an existing magnetic field in an ROI using shims.

BACKGROUND OF THE INVENTION

Permanent magnets are of great value in many fields of science and engineering. In particular, they find application in the field of Magnetic Resonance Imaging (MRI) and Spectroscopy (MRS). Within these latter applications it is of paramount importance that extremely high degrees of magnetic field homogeneity (of the order of one part per million) are achieved within an ROI.

In permanent magnets the distribution of the magnetic material determines how the resulting magnetic field varies over space. In both permanent magnetic and electromagnetic MRI and MRS machines, manufacturing imperfections result in unacceptable inhomogeneities. To improve the homogeneity of an existing field over an ROI it is known to place permanent magnetic materials (termed passive shims) in the magnetic field to achieve this improvement of homogeneity.

The problem of distributing magnetic material to produce, or modify an existing magnetic field is one of a class known collectively as the near field problem. In particular, it requires the determination of the distribution of material to produce a field of particular character—varying in a specific manner in space, for example a uniform field in a proximate region. The total magnetic field from a magnetic structure is a nonlinear convolution of the spatial distribution of material with the field of a magnetic dipole. While it is relatively straightforward to determine the resulting field from a given distribution of magnetic material, generally, the components of a convolution are not invertable. Consequently, determining the optimum distribution of magnetic material to produce a magnetic field of a specific type in an ROI has proven to be extremely difficult.

One known method of electromagnetic coil design is the Target field approach as disclosed in European Patent No. EP-A-0 252 634 or its US equivalent U.S. Pat. No. 4,896,129. As it is based on an assumed a priori mathematical expression for the total field, an optimum resulting field is hard to achieve.

An alternative approach is disclosed in European Patent EP-A-0601101 and its US equivalent U.S. Pat. No. 5,266,913, the content of which is hereby incorporated by reference. It is concerned with the design of shielded electromagnetic coils, and employs forward substitution and least squares minimization to optimize the field produced by electromagnets specifically within the ROI, whilst achieving a null field outside of the confines of the coil structure.

There are significant differences in the form of the magnetic fields generated by active electromagnets, and those resulting from the use of magnetic materials. Consequently, electromagnetic coil design and the design of permanent magnets involve quite separate design considerations.

The object of the present invention is to achieve an improved method of designing permanent magnetic structures.

SUMMARY OF THE INVENTION

In accordance with the present invention there is provided a method of designing a permanent magnetic structure for generating a desired magnetic field in a region of interest (ROI) comprising:

setting the dimensions of the permanent magnetic structure setting a hypothetical distribution of magnetic material over the surface of said structure for each member of a finite set of spatial frequency harmonics of unit magnetisation amplitude calculating the magnetic field in the ROI from each member of said set calculating amplitudes of said harmonics by the method of least squares in order to achieve the optimum approximation to the desired field in the ROI scaling the members of said set according to said optimised harmonic amplitudes establishing, by summing said scaled members, the required distribution of magnetic material in order to generate the desired magnetic field.

The permanent magnetic structure may either be a permanent magnet assembly for producing a magnetic field ab initio, or may be a permanent magnetic structure for modifying an existing magnetic field, by means of shimming.

The method may also be applied iteratively in order to take into account the finite thickness of the required distribution magnetic material, which will inevitably have influence on the field.

Further preferred embodiments of the present invention are presented in the dependent claims.

BRIEF DESCRIPTION OF THE DIAGRAMS

THEORY

Figure 1:
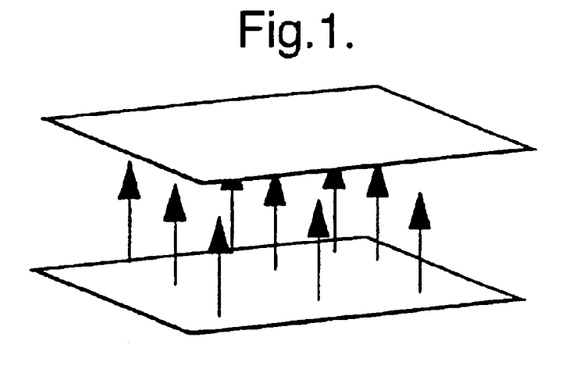
FIG. 1 shows a schematic representation two parallel, finite, flat plates upon which magnetic material is distributed.
Figure 2:
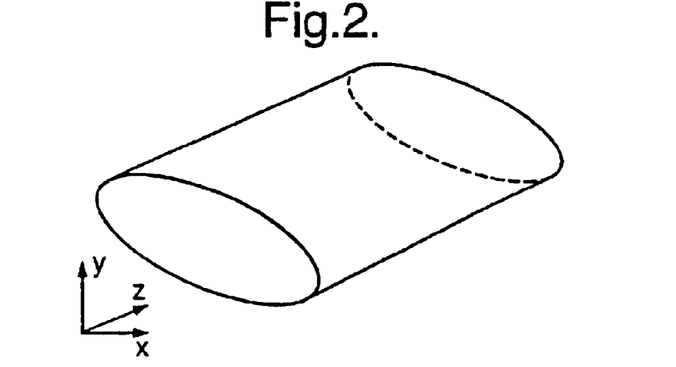
FIG. 2 shows an alternative distribution composed of a hollow elliptical, cylindrical structure upon which magnetic material is distributed.

The design of magnets for MRI and MRS is commonly based upon the forms of simple geometric surfaces. The two most common of these are: a structure composed of parallel, finite, flat surfaces between which a uniform magnetic field is created as illustrated in FIG. 1; and a structure with an elliptical, cylindrical opening within which a uniform field is produced by the surrounding distribution of material as illustrated in FIG. 2.

Figure 3:
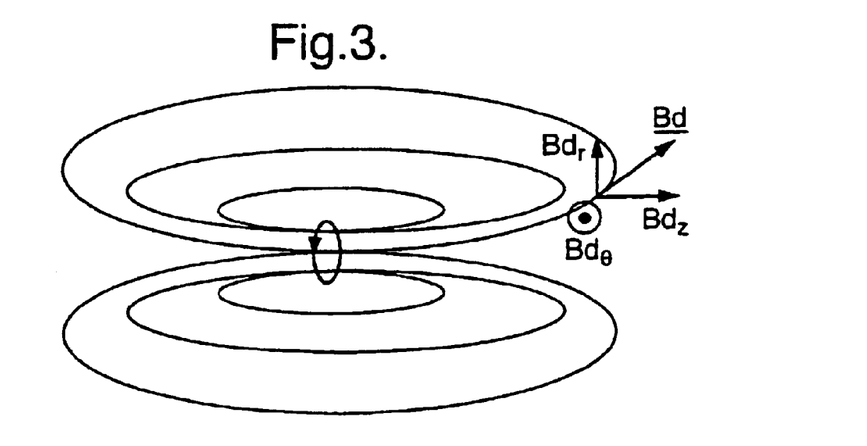
FIG. 3 shows the magnetic dipolar field ($\underline{Bd}$) produced by magnetic material, resolved into orthogonal components $Bd_r$, $Bd_z$ and $Bd_\theta$.

With reference to FIG. 3, the magnetic dipolar vector field ($\underline{Bd}$) produced by magnetic material can be resolved into its cylindrical polar components $Bd_z$, $Bd_\theta$ and $Bd_r$. In these coordinates (r, θ, z), the vector field of such an infinitesimal dipole has the general form:

$$Bd_z(r,z) = \mu m(2z^2 - r^2)/4\pi(r^2 + z^2)^{5/2} \quad (1a)$$

$$Bd_\theta(r,z) = 0 \quad (1b)$$

and $$Bd_r(r,z) = \mu m 3zr/4\pi(r^2 + z^2)^{5/2} \quad (1c)$$

where $\mu$ is the permeability of the medium in the ROI and m is the magnetic dipole moment. The field due to the circulation of an electron in an atom approximates this very closely for distances $(r^2+z^2)^{1/2}$ that are very much greater that the radius of the orbit (typically $10^{-10}$ m). For the purposes of passive magnet design within the present context this approximation holds extremely well.

The magnetic field from matter in bulk can be derived from equation 1. For the axial component of the magnetic field this is given by:

$$B_z(\underline{r},z) = \mu \int \{M_z(x,y,z)(2(z-z')^2 - [(x-x')^2 + (y-y')^2])/4\pi|\underline{r}-\underline{r}'|^5\} d\tau' \quad (2)$$

where the underlining of individual items indicates that they are vector quantities and $M_z$ is the axial component of magnetization ($\underline{M}$). Similar expressions can be derived for the field in the other directions.

For paramagnetic and diamagnetic materials the magnetization $\underline{M}$ is given by:

$$\underline{M} = X_m \underline{Bm} \quad (3)$$

where $\underline{Bm}$ is the main, magnetizing field and $X_m$ is the susceptibility. In general, $X_m$ is a tensor of rank two. However, for isotropic materials it reduces to one of rank zero, e.g., for diamagnetic copper $X_m = -1.0 \times 10^{-5}$; and for paramagnetic aluminium $X_m = 2.3 \times 10^{-5}$.

Equation (2) shows that the magnetic field is the convolution of the magnetization distribution with a spatial dispersion function. Problems of this nature can be conveniently solved by Fourier transforming into the kernel space (k-space) where the convolution becomes a simple multiplication, which greatly facilitates subsequent calculations. Indeed, for certain simple geometric structures, such as cylinders, there is no simple analytic expression for the magnetic field in real space, while there is one for the field in k-space. The existence of such an expression in k-space expedites the process of handling the above equations but it is not a necessary condition of the design method of the present invention. Indeed, the method is generally applicable, as is illustrated in the following examples.

DESCRIPTION OF THE PREFERRED EMBODIMENTS

The design of a permanent magnetic structure according to the invention will now be described in general terms. The geometry and overall dimensions of the desired structure are set, as is a hypothetical distribution of magnetic material over the surface of the structure for each member of a finite set of spatial frequency harmonics of unit magnetization amplitude. The field within the ROI from an element of the magnetic material of unit magnetization can then be determined. When numerical methods are employed the field must be determined to a point where it approximates zero in the directions in which it is to be Fourier Transformed (FT'ed). This field is then FT'ed. The resulting field in Fourier kernel space (k-space) is multiplied by the FT's of a set of the permissible harmonics (the lowest spatial frequency harmonics of the initial magnetic field distribution) of the magnetization on the surface. These resulting fields in k-space are subsequently inverse FT'ed to yield the fields in real space that are produced by each of the permissible harmonics in the selected set. These fields are fitted to the required field within the ROI to determine the amplitudes of the magnetization harmonics that minimize the sum of the squares of the deviation of the actual field from the required one. Fitting is performed using sets containing successively higher order harmonic components until the sum of the squares of the deviations of the achievable field from the desired one becomes sufficiently small. Eventually a point will be reached where deviations due to manufacturing tolerances will dominate, and no further practical improvement will be possible.

For simple geometric structures, such as a circular cylinder, this process can be facilitated by directly calculating the fields in Fourier k-space.

The advantage of least squares fitting lies in its convenient mathematical properties. For example, it commutes with the Fourier transform; as the FT itself is a specific example of least squares minimization.

The following discussion serves to illustrate the method of the present invention only and is not intended to limit its general applicability.

In a first embodiment of the present invention, the method is applied to design a magnet where magnetic material is distributed on the curved surface of a cylinder to produce a uniform field.

Figure 4:
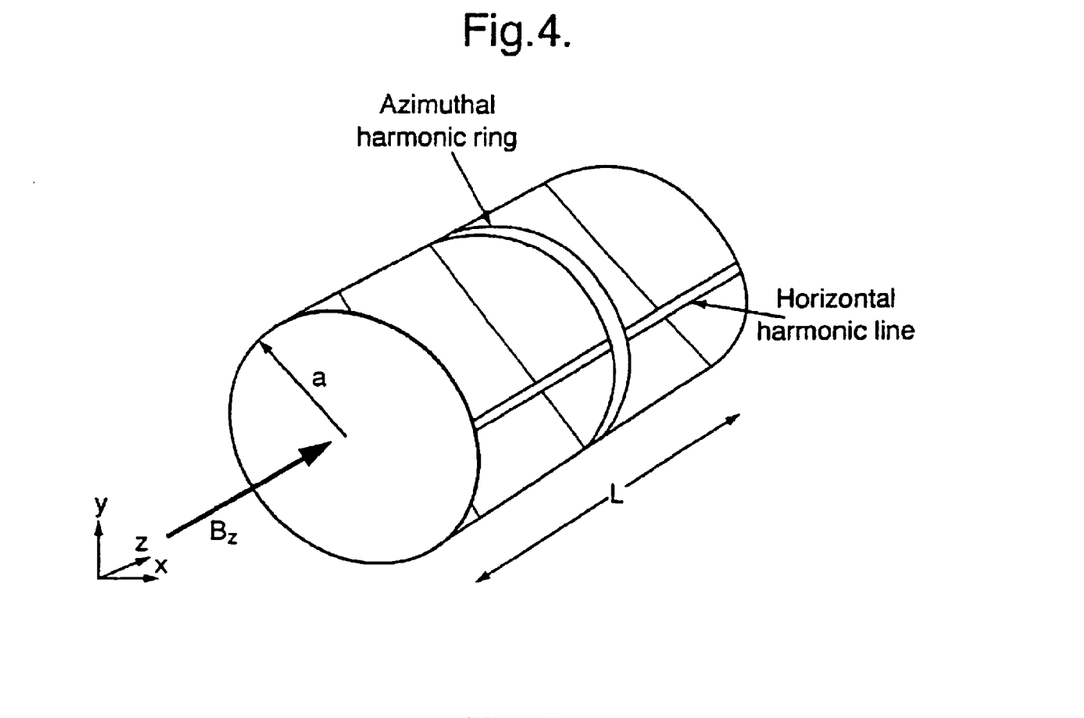
FIG. 4 shows schematically a hollow, cylindrical structure with a circular cross-section, upon which magnetic material is distributed.

For the present purposes it will be supposed that it is required to create a uniform axial magnetic field $B_z$ of 0.1T over a cylindrical ROI of length 0.4 m and radius 0.125 m by distributing magnetic material on the curved surface of a circular cylinder, such as that shown in FIG. 4, having a length L of 2 m and radius a of 0.25 m. The cylindrical ROI and surrounding cylindrical structure are concentric and coaxial along the z axis. For simplicity it will be assumed that the thickness of the magnetic shell is small compared to the diameter of the magnet, for the present purposes infinitesimal. In practice, a more elaborate calculation may be required to take into account the thickness, as described later.

Conveniently, optimization is performed over a representative set of radii spanning the ROI, e.g. six radii at intervals of 20% from 0 to 100% of the radius of the ROI within the ROI. However, for the present example, optimization over just two curved cylindrical surfaces of diameter of 0 m and 0.25 m and lengths 0.4 m, was sufficient, as demonstrated by table 3 and FIG. 12 (explained below).

Figure 5:
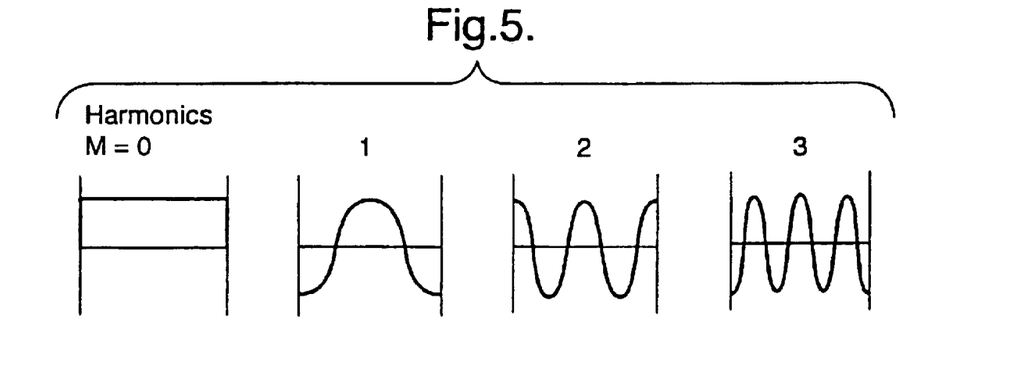
FIG. 5 shows the permissible, even, cosinusoidal axial harmonics of the magnetic material distribution on a structure of finite length.

The distribution of magnetic material on the surface of the structure shown in FIG. 4 can be conveniently described in terms of a series of orthogonal azimuthal and axial, sinusoidal and cosinusoidal, harmonics. The azimuthal harmonics form a discrete set of cosinusoidal terms $\cos(m\phi+\alpha)$ and the axial harmonics form a truncated set of $H(z) \cos(n\theta+\beta)$, as illustrated in FIG. 5, where $H(z)$ is the unit step function given by:

for $|z| \leq L/2$ $H(z)=1$ for $|z| \geq L/2$ $H(z)=0$ (4)

where L is the length of the cylindrical surface and $\alpha$ and $\beta$ are phase terms that take account of both the sinusoidal and cosinusoidal terms.

In many applications the set of harmonics is severely curtailed by considerations of symmetry. For example, for the present uniform field there is no azimuthal variation and all azimuthal terms other than m=0 are zero. Consequently, the problem of optimization reduces to a one-dimensional one of determining just the axial variation. Further, as the ROI and the structure are concentric the resulting even symmetry of the system implies that all sinusoidal terms are also zero leaving only the purely cosinusoidal terms. It remains to determine the amplitudes of each of the significant cosinusoidal terms to produce an optimum uniformity of the field within the ROI on the basis of the minimum sum of least squares deviations of the field.

Figure 6:
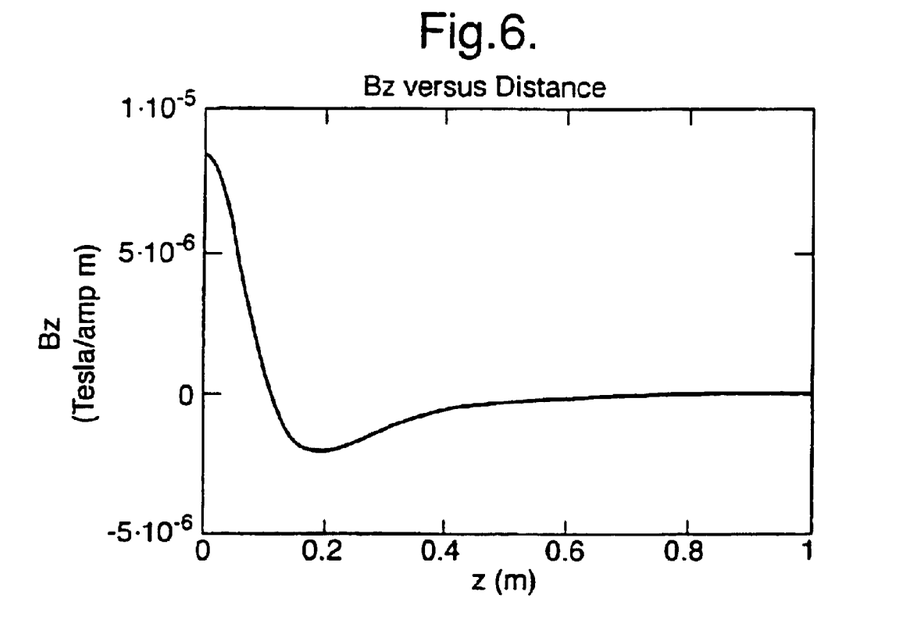
FIG. 6 is a plot of the axial magnetic field $Br_z$ against distance z resulting from an infinitesimal circular ring of uniformly magnetic material of unit magnetization calculated directly by numerical integration.

Now the field from an elemental magnetic dipolar ring of unit magnetization can be determined by numerically integrating equation (2). FIG. 6 shows how the resulting magnetic field varies with distance, in the axial direction, at a radius of 0.1 m from such a dipolar ring of diameter 0.5 m.

Figure 7:
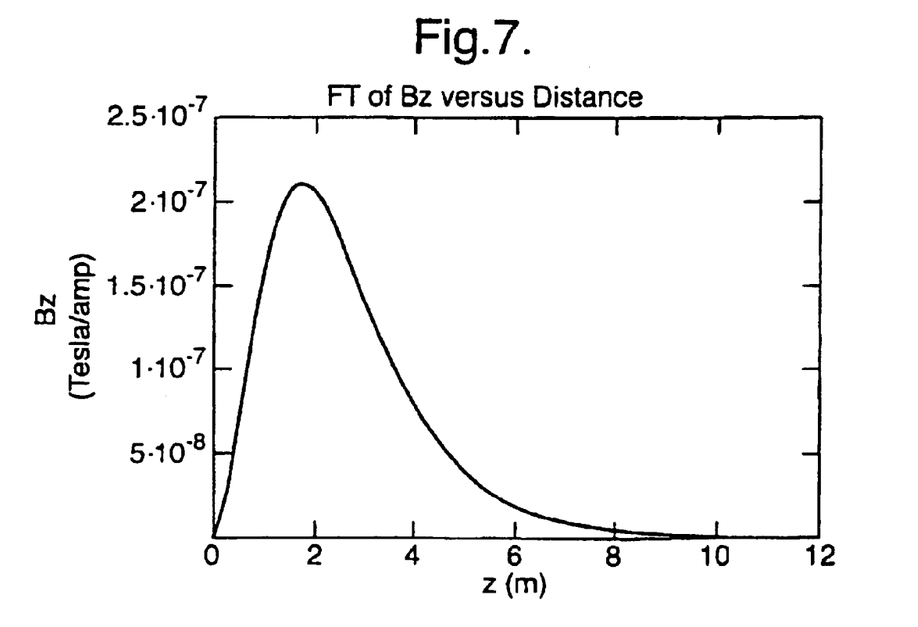
FIG. 7 shows a plot of the Fourier Transform (FT) in the axial direction (z) of the axial magnetic field of FIG. 6.

From equation (2) we also know that the magnetic field from individual axial harmonics is the convolution of the field from this ring with the harmonic. This convolution is most conveniently performed by simple multiplication in the Fourier domain. Consequently, the next step in the design process is to FT this field in the axial direction z; the resulting FT is shown in FIG. 7.

Alternatively, for a simple geometric surface such as this, the FT in the axial direction of the axial component $Br_z$ of the ring field, $\underline{Br}$, can be expressed analytically as:

for $r \leq a$ $Br_z(r,m,k) = -\mu a k^2 I_m(|k|r) K_m(|k|a)/2\pi$ (5a)

for $r \geq a$ $Br_z(r,m,k) = -\mu a k^2 I_m(|k|a) K_m(|k|r)/2\pi$ (5b)

where $I_m$ and $K_m$ are the modified Bessel functions.

Figure 8:
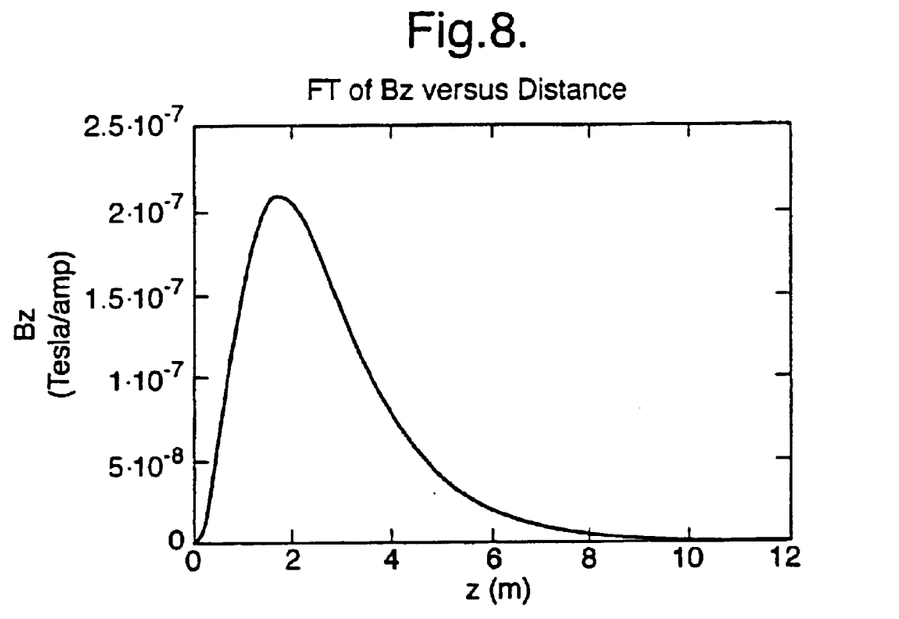
FIG. 8 shows a plot of the FT, in the axial direction, of the axial magnetic field resulting from an infinitesimal circular ring of uniformly magnetic material of unit magnetization evaluated by an alternative, analytical method, directly in the Fourier Kernel domain (k-space).

FIG. 8 shows the FT in the axial direction of the axial component $Br_z$ of the ring field, $\underline{Br}$, evaluated directly by equation 5a. This is substantially identical to the field derived by numerically integrating the generally applicable equation (2) and then Fourier Transforming it, as can be seen by comparing FIGS. 7 and 8.

Although evaluating the FT directly by means of equation (5a) facilitates the process, this method is not applicable to structures where an exact solution in the Fourier kernel domain is not available. The longer route of numerical integrating equation (2) and subsequent FT'ing has general application for any structure, as it does not rely upon there being an analytic form of the equations in either real or k-space.

Now, for an open cylinder of restricted length, L, the total magnetization, $M_z$, can be expressed as the sum of the permissible axial harmonic modes, n, on the surface as follows:

$$M_z(a, z) = \Sigma_n C_n H(z) \cos(2\pi nz/L - \phi)$$ (6)

where $C_n$ is the amplitude of the nth magnetization harmonic. The FT of this in the z-direction is:

$$M_z(a, k) = \pi L \Sigma_n C_n [e^{i\phi} \text{sinc}(kL/2 - n\pi) + e^{-i\phi} \text{sinc}(kL/2 + n\pi)]$$ (7)

Therefore, the FT of the total resultant field from the cylindrical surface is simply the product of the FT of the magnetization with the FT of the elementary ring field within this domain, i.e.:

$$B_z(r, m, k) = M_z(a, k) Br_z(r, m, k)$$ (8)

Optimization of the distribution can is then solved by least squares minimization of the first few terms ($C_n$) over the ROI in real, as against kernel, space. The number of terms is dependent upon the geometries of the coil structure and the ROI. This can be determined by solving with increasing numbers of terms ($C_n$) until a sufficiently homogeneous field has been attained.

In the above example the first 3, 4 and 5 harmonic amplitudes (coefficients) were employed and the worst deviation from the field in the ROI determined (see Table 1). Optimization over more than 5 harmonic coefficients has no further significant effect. As can be seen from Table 1, the maximum deviation of the field in the ROI drops to ~1 ppm within the first 5 terms. In any case, practical considerations, such as manufacturing tolerances and the finite thickness of the structure, mean that further improvements in field uniformity are impractical. Further approximation can be achieved by shimming the magnet in some fashion, for example along the lines discussed in the second embodiment below.

TABLE 1

Field deviation with number of harmonic components employed.

| No. of Harmonics | Range of Harmonics | Max deviation in ROI |
|---|---|---|
| 3 | 0–2 | 200 ppm |
| 4 | 0–3 | 16 ppm |
| 5 | 0–4 | 1 ppm |

Figure 9:
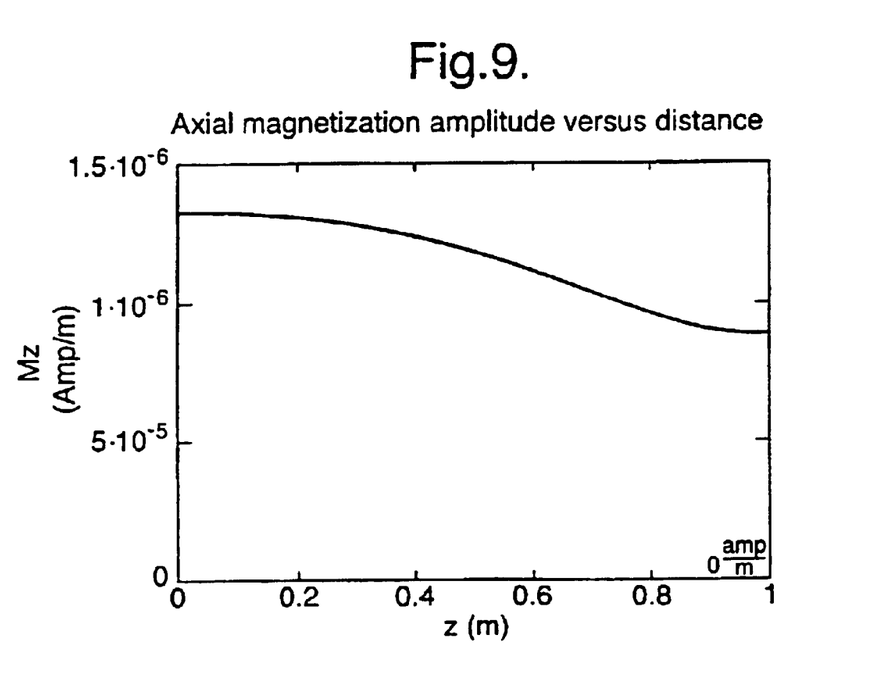
FIG. 9 shows a plot of the axial distribution of magnetic material that will achieve an optimal, uniform field, designed in accordance with a first embodiment of the present invention.

The harmonic amplitudes of table 2 were used to determine the axial distribution of magnetic material (M=1.28× $10^6$ amp/m, equivalent to the magnetization of saturated iron) on the surface of the hollow cylindrical structure, as shown in FIG. 9.

Figure 10A:
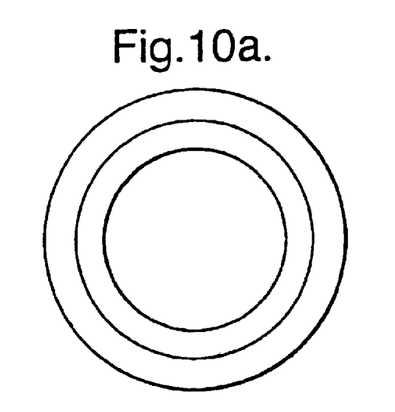
FIG. 10 shows a schematic representation of a magnetic structure designed in accordance with the invention, to generate the distribution shown in FIG. 9.
Figure 10B:
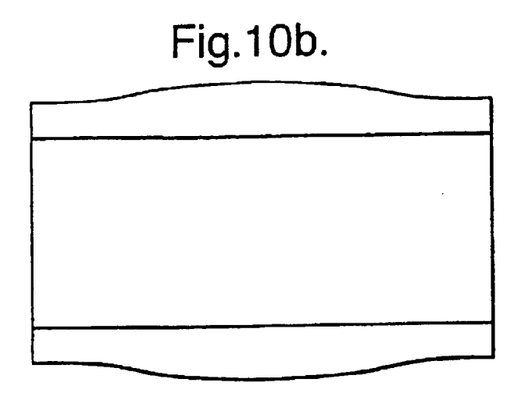

FIG. 10 shows a practical implementation of a magnetic structure designed in accordance with the invention, to generate the distribution shown in FIG. 9.

TABLE 2

The harmonic amplitudes for a uniform field.

| Harmonic No. | Amplitude (amps/m) |
|---|---|
| 0 | −1,143,966 |
| 1 | −220,943 |
| 2 | 37,362 |
| 3 | −6,821 |
| 4 | 749 |

Figure 11:
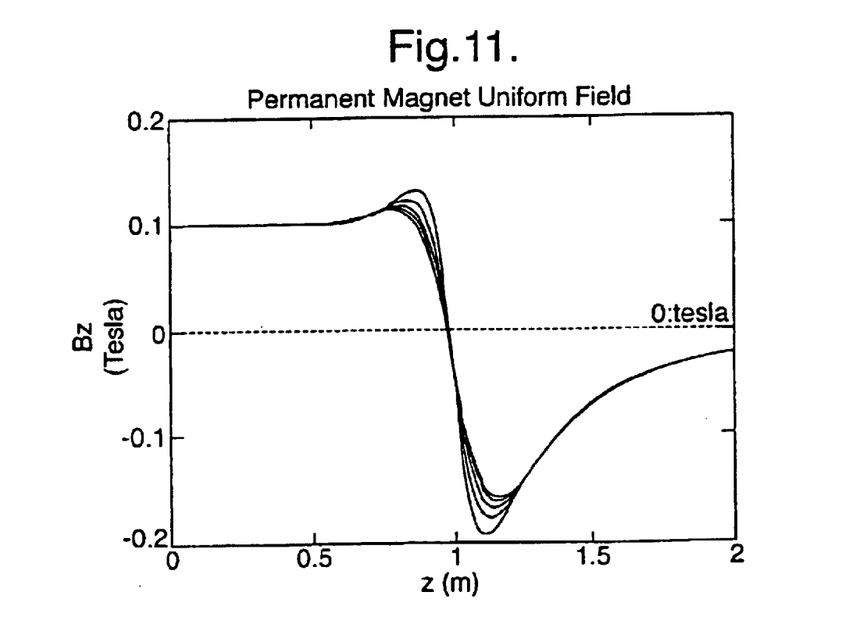
FIG. 11 shows a plot of the resulting axial magnetic field in the axial direction produced by the distribution of magnetic material shown in FIG. 9.
Figure 12:
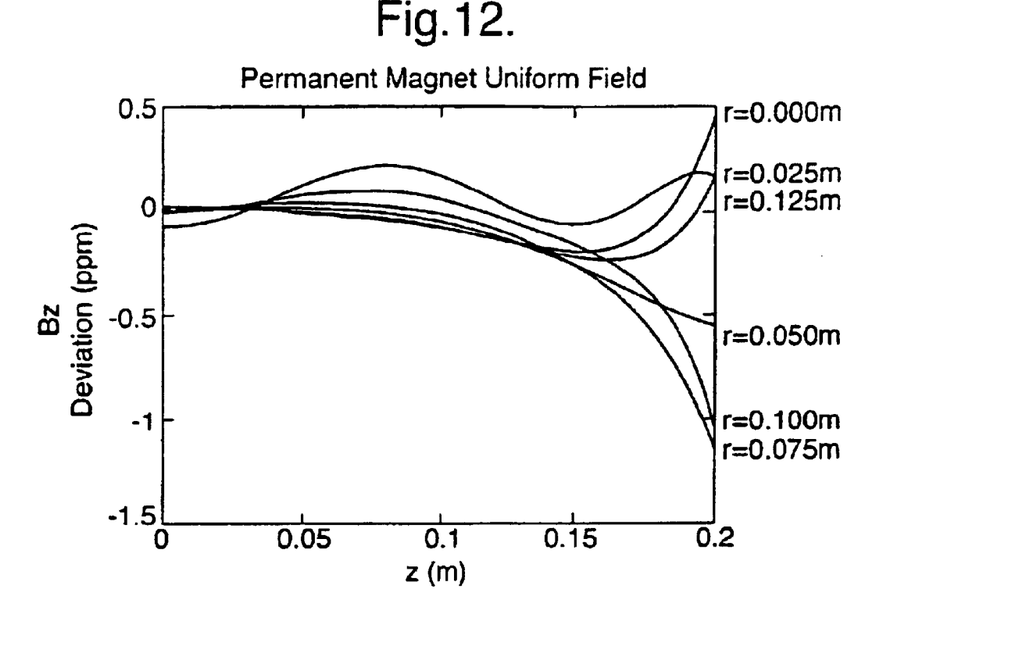
FIG. 12 shows a plot of the deviation of the above magnetic field from the desired, uniform one, in parts per million (ppm), over the ROI.
Figure 13:
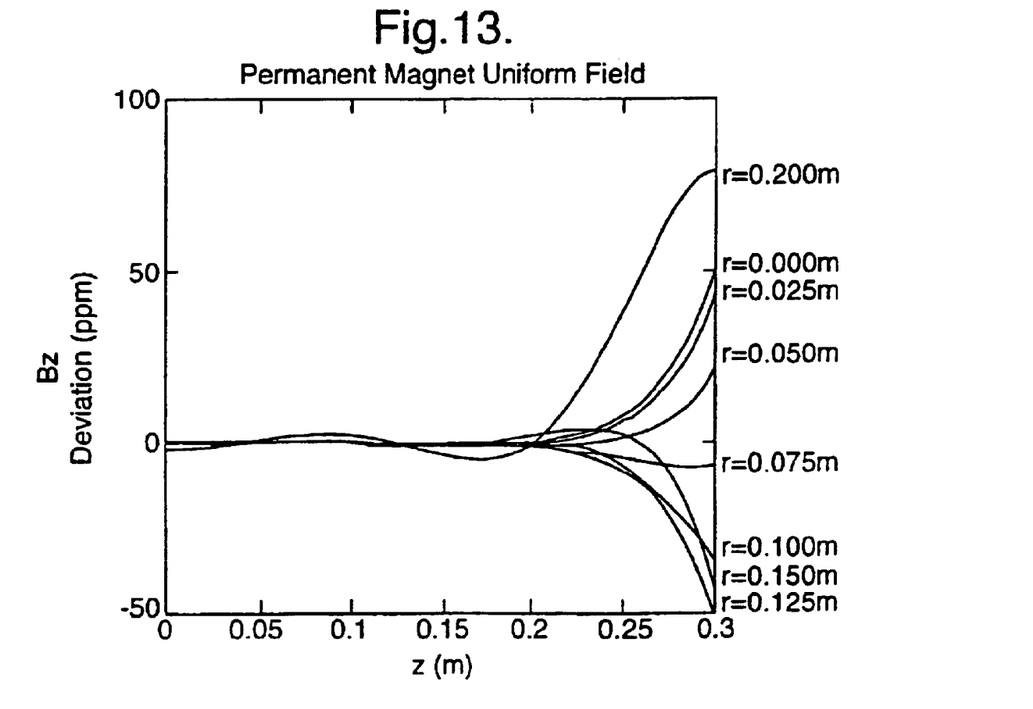
FIG. 13 shows a plot of the deviation of the above field over, and proximate to, the ROI.

FIG. 11 shows the resulting magnetic field at a series of radii (0, 2.5, 5, 7.5, 10 and 12.5 cm) plotted in the axial direction produced by the distribution of magnetic material, according to the present invention, as shown in FIG. 9. FIG. 12 shows the deviation of the above magnetic field from the desired, uniform one, in parts per million (ppm), over the ROI. FIG. 13 shows how the field diverges rapidly outside the ROI in the axial direction, but remains reasonably homogeneous in the radial direction; see also Table 3 below.

TABLE 3

Maximum field deviation in the ROI at each radius.

| Radius cm (% fraction of magnet) | Maximum deviation in ROI |
|---|---|
| 0.0 (0) | 0.460 ppm |
| 2.5 (10) | 0.160 ppm |
| 5.0 (20) | −0.541 ppm |
| 7.5 (30) | −1.133 ppm |
| 10.0 (40) | −1.011 ppm |
| 12.5 (50) | 0.164 ppm |
| 15.0 (60) | 2.011 ppm |
| 20.0 (70) | −4.730 ppm |

As demonstrated by the above figures, the resulting field is uniform to a very high degree in the central region.

FIG. 11 serves to highlight the fundamental inapplicability of methods that attempt to invert the field equations to the design of permanent magnetic structures. Due to the complexity of the field, it is inconceivable that even someone highly conversant with the design of magnets could arbitrarily specify a field such as that of FIG. 11 with the required degree of accuracy to ensure a practically realizable distribution that would yield a reasonably good approximation to the desired field in the ROI; essentially this would require a knowledge of the result of the process before the process had begun. Certainly, this would not yield the uniformity attained by the present technique which only requires the specification of the known, desired field within the ROI.

In accordance with a second embodiment of the present invention, the design method is applied to homogenize an existing field by distributing magnetic material on the curved surface of a circular cylinder, of the type shown in FIG. 4. For the purpose of illustrating this example, the existing field is assumed to be oriented in the z-direction and is substantially uniform except for a first order (linear) transverse variation (inhomogeneity) in the ROI. It is to be appreciated that the design method is by no means limited to compensating for a linear variation, but is generally applicable to shimming for any inhomogeneity.

As in the previous embodiment, the magnetic surface is arbitrarily assumed to be 0.5 m in diameter and 2 m in length, with a cylindrical ROI of diameter 0.25 m, and length 0.4 m. Optimization was performed on a representative curved cylindrical surface of diameter 0.2 m and length 0.4 m to produce a transverse linear gradient field of 0.1 milliTesla per meter. Again, table 5 below and FIG. 17 demonstrate that this is indeed representative of the ROI.

For simplicity it will again be assumed that the thickness of the magnetic shell is small compared to the diameter of the magnet, for the present purposes infinitesimal. In practice, for the creation of shim structures this approximation will hold and more elaborate calculations will generally not be necessary.

From symmetry considerations, an azimuthal variation of cos ($\phi$), corresponding to a linear transverse variation, in the field can only be produced by a first order variation (m=1) in the magnetic material. This again reduces the problem to a one-dimensional one of determining just the axial variation.

The FT of the field can be determined directly from equation 5a. Optimization of the shim is then conveniently solved by least squares minimization of the first few terms ($C_n$) over the ROI in real, as against kernel, space.

Figure 15:
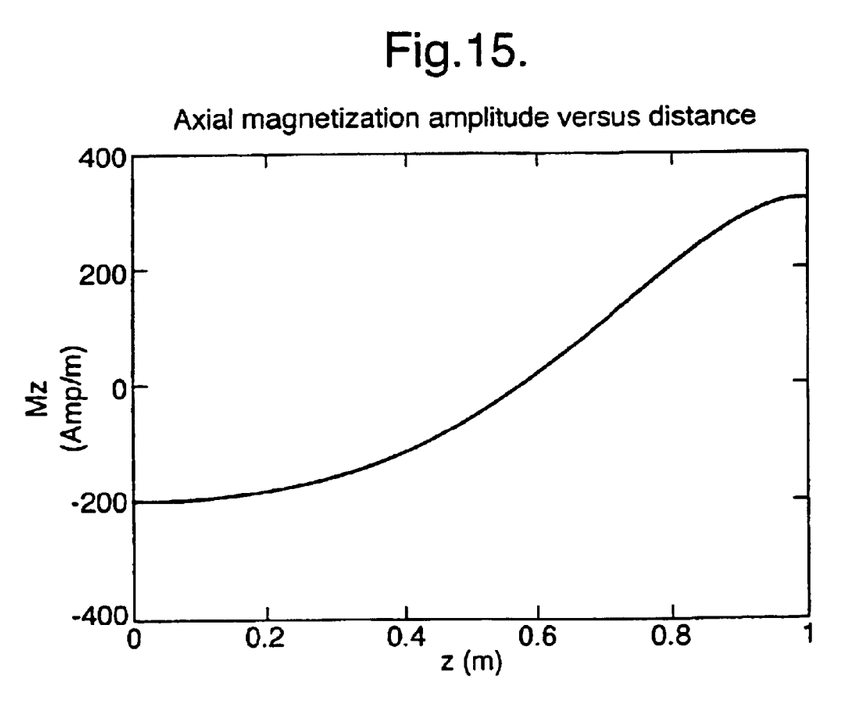
FIG. 15 shows a plot of the amplitude of the optimum axial distribution of magnetic material over a cylindrical structure to provide a magnetic field that varies linearly in a transverse direction in the ROI, designed in accordance with the present invention.

In this embodiment coefficients 1, 2, 3 and 4 were necessary as can be seen from table 4. From inspection, it was noted that the zeroth coefficient contributed negligibly to the central field, so this too could be omitted. The amplitude of the required axial distribution is shown in FIG. 15. The distribution varies azimuthally as cos($\theta$) (with amplitude=1.28×$10^6$ amp/m) on the surface of the cylindrical structure to provide a magnetic field that varies optimally, linearly, transversely (Bz(x)=x.100 microTesla/m) over the ROI.

Figure 14:
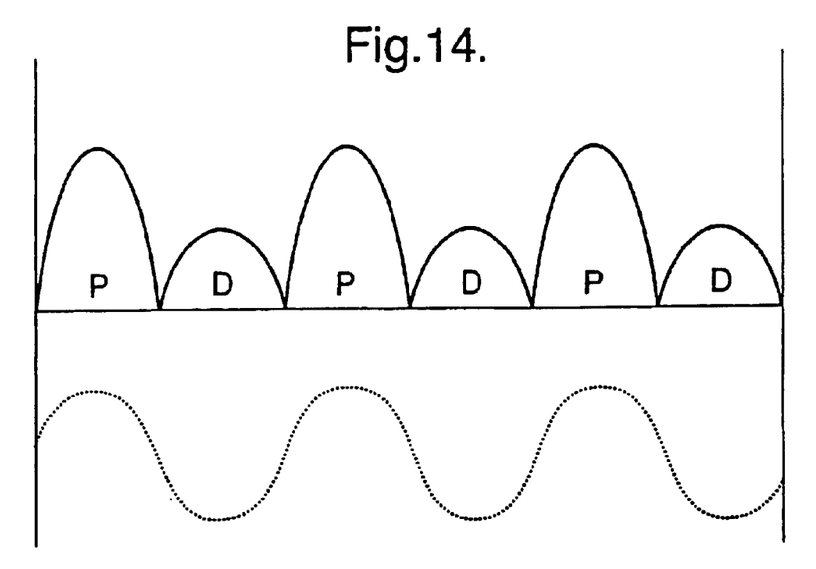
FIG. 14 shows how a distribution of paramagnetic and diamagnetic materials on a surface can be arranged to produce a sinusoidal variation of magnetization along that surface.
Figure 16A:
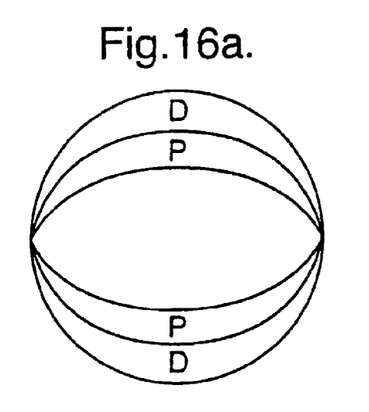
FIG. 16 shows a schematic representation of how a shim magnetic structure designed in accordance with the invention and using diamagnetic and paramagnetic materials as illustrated in FIG. 14 could be employed to generate the distribution shown in FIG. 15.
Figure 16B:
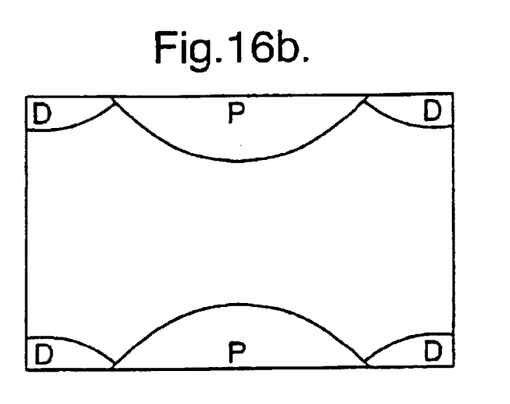

FIG. 16 shows how a shim magnetic structure designed in accordance with the invention and using diamagnetic and paramagnetic materials as illustrated in FIG. 14 may be implemented in practice, to generate the distribution shown in FIG. 15.

Figure 17:
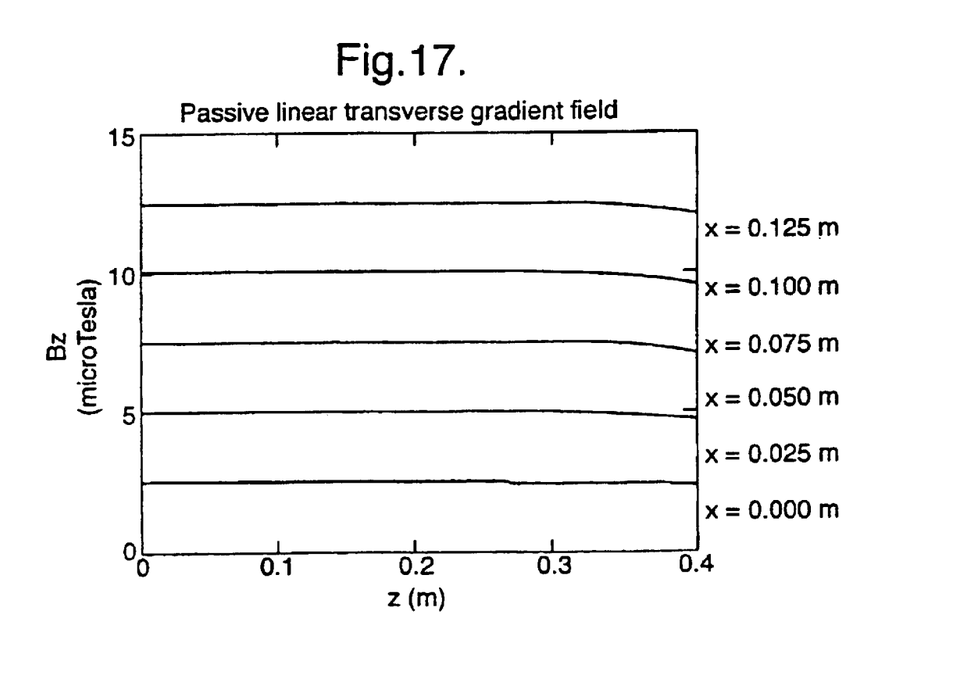
FIG. 17 shows a plot of the resulting axial component of the gradient magnetic field at a series of radii in the axial direction produced by the distribution of magnetic material shown in FIG. 15.

FIG. 17 shows the resulting gradient magnetic field at a series of radii (0, 2.5, 5, 7.5, 10 and 12.5 cm, 15 cm), plotted in the axial direction, produced by the distribution of magnetic material shown in FIG. 15. Note that the linearity remains excellent far outside the ROI.

TABLE 4

The harmonic amplitudes for a linear transverse field.

| Harmonic No. | Amplitude (amps/m) |
|---|---|
| 1 | 247 |
| 2 | −59 |
| 3 | 15 |
| 4 | −2 |

The resulting magnetic field is linear to a very high degree in the central region, see table 5 and FIG. 17. Certainly, the degree of linearity is well within the limitations of first order approximation adopted and of the errors associated with manufacturing. Consequently, such a shim designed in accordance with the present invention will correct the linear inhomogeneity to a very high order of accuracy. As mentioned above, the design method of the present invention is not limited to correction of linear variations, and a similar to degree of correction can be anticipated generally, for any conceivable inhomogeneity.

TABLE 5

Center field in the ROI at each radius for a linear transverse shim.

| Radius cm (% fraction of magnet) | Bz (microTesla) |
|---|---|
| 0.0 (0) | 0.000000 |
| 2.5 (10) | 2.499998 |
| 5.0 (20) | 4.999995 |
| 7.5 (30) | 7.499989 |
| 10.0 (40) | 9.999974 |
| 12.5 (50) | 12.499929 |

It is to be appreciated that, generally, the lowest spatial frequency harmonics are chosen, but this will not always be necessary as witnessed by the example above.

The number of terms over which the optimization is performed may be reduced by incorporation of an additional, hypothetical, arbitrary distribution of magnetic material over the surface of the structure into the set of spatial frequency harmonics. By "arbitrary" it is to be understood that a suitable distribution is determined by appropriate consideration of the desired field. For example, to achieve a field that varies linearly along a flat surface of magnetic material, an appropriate distribution might be one whose magnetization also varies linearly along that surface.

The method of the invention can be applied to the design of shims in several ways. One of these is to fit the dipole harmonics directly to the entire field inhomogeneities, as illustrated above. Another is to fit the dipole harmonics to individual spherical harmonic terms of the field. The rationale for the latter is that it is common practice to map the field in these linearly independent spherical harmonic terms. The required shim is then the linear combinations of the shims for the individual spherical harmonic terms weighted appropriately. This second method is advantageous when shimming a series of magnets of the same physical dimensions, as the shim dimensions remain constant and consequently the spherical harmonic shims form a standard set. The resulting shim from the example above effectively also represents one component of such a set.

The required distribution of magnetization can be achieved in several ways. In one preferred embodiment the thickness of a single magnetic material can be varied in proportion to the required distribution. This is perfectly adequate for the production of uniform fields such as described in the first embodiment provided the thickness of the material is small in comparison with the sizes of the structure and the ROI. Where this is not the case the process must be refined by shimming along the lines outlined for the second embodiment.

Figure 18:
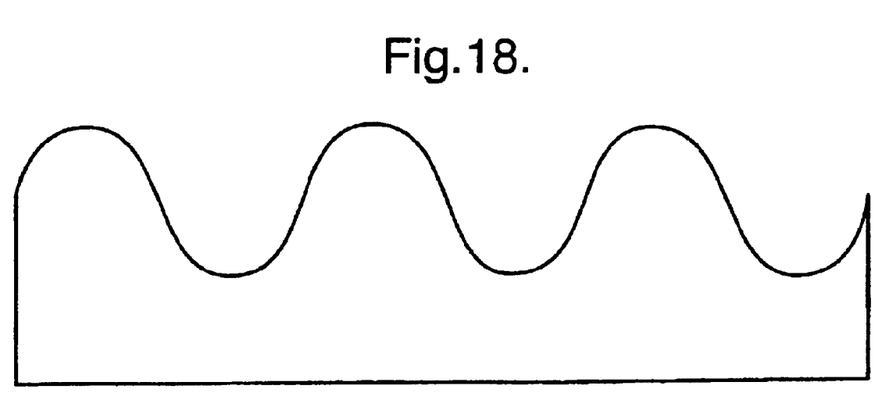
FIG. 18 shows how the sinusoidal variation of thickness in a single unidirectional magnetic material can provide a sinusoidal variation of magnetization for the purpose of shimming.

For the purpose of shimming the use of a single unidirectional material cannot produce a magnetization that varies sinusoidally, but if an additional uniform field can be tolerated simply varying the thickness of the material sinusoidally in the manner shown in FIG. 18 produces acceptable permissible harmonic magnetization components of the form A-cos(mθ) and A-sin(mθ), in the example illustrated, 2-sin(3θ).

In another preferred embodiment distributing materials of differing magnetization in the vicinity of the ROI can be used to achieve the desired local magnetization. By using differing thicknesses of materials that have opposite susceptibilities harmonic components of the form cos(mθ) and sin(mθ) are possible. For example, for a cylindrical surface consisting of a semicircular (0<θ<π) distribution of paramagnetic aluminium ($X_m = 2.3 \times 10^{-5}$), whose thickness varies as 0.435 A $|\sin(θ)|$ and an opposing semicircular (−π<θ<0) distribution of diamagnetic copper ($X_m = -1.0 \times 10^{-5}$) whose thickness varies as A $|\sin(θ)|$, produces a magnetization that varies as A sin(θ) to first order over the whole surface (−π<θ<π), in a similar manner to that shown in FIG. 14. Alternatively, the magnetization distribution shown in FIG. 15 could be achieved by machining the above sinusoidal contour on cylinders of paramagnetic and diamagnetic material in this manner.

A material of any required magnetism can be constructed by combining paramagnetic and diamagnetic materials in the required proportions. For example, a material that has effectively zero magnetization can be formed from a combination of 30.3% aluminium and 69.7% copper. This could be a great value in manufacturing objects for use in magnetic fields that would not affect the field, or be affected by the field. In practice, the proportions may have to be altered slightly to take into account the higher order effects when such materials are combined.

For either creating a uniform field or altering an existing one, the thickness of the magnet will be a significant fraction of the diameter and the consequent placement of material will affect the actual attainable field. To take account of this, the method can be applied iteratively as follows, by:

calculating the distribution of magnetic material to produce an optimum approximation to a desired magnetic field in the ROI, in accordance with the method described herein determining the total resultant field in the ROI taking into account the thicknesses and placements of magnetic materials involved calculating a corrected magnetic material distribution representative of the difference between said total resultant field and said desired field repeating the latter two steps until the field attained approximates the desired one in the ROI to a sufficient degree.

It is to be appreciated that the homogeneity of the field generated by a magnetic structure designed in accordance with the present invention can be further enhanced by additional active shimming. Resistive electromagnetic shimming may subsequently be employed to further improve the homogeneity during the use of the magnet. This is particularly relevant at high field strengths with gradient echo techniques where the natural susceptibility of the sample distorts the field, in other words, where resistive electromagnetic shimming can be employed to improve the homogeneity for each sample.

Whilst the above embodiments have been described in the context of magnets of cylindrical form, it is appreciated that the method of the invention is equally applicable to the design of magnets of other geometric forms, one example of which is the parallel flat plate arrangement shown in FIG. 1.

what is claimed is:

1. A method of designing a permanent magnetic structure for generating a desired magnetic field in a region of interest (ROI) comprising:

setting the dimensions of the permanent magnetic structure setting a hypothetical distribution of magnetic material over the surface of said structure for each member of a finite set of spatial frequency harmonics of unit magnetisation amplitude calculating the magnetic field in the ROI from each member of said set calculating amplitudes of said harmonics by the method of least squares in order to achieve the optimum approximation to the desired field in the ROI scaling the members of said set according to said optimised harmonic amplitudes establishing, by summing said scaled members, the required distribution of magnetic material in order to generate the desired magnetic field.

2. A method according to claim 1 wherein the desired field represents a modification of an existing magnetic field.

3. A method according to claim 2 wherein the desired field represents the deviation from a required field generated by an existing magnetic structure.

4. A method according to claim 3 wherein the desired field represents one of the harmonics of the magnetic field over the ROI.

5. A method according to claim 4 wherein each said harmonic results in a shim, to create a set of shims representative of the weighted sum of the individual harmonics.

6. A method according to claim 2 comprising:

calculating the distribution of magnetic material to produce an optimum approximation to a desired magnetic field in the ROI, in accordance with the method described herein determining the total resultant field in the ROI taking into account the thicknesses and placements of magnetic materials involved calculating a corrected magnetic material distribution representative of the difference between said total resultant field and said desired field repeating the latter two steps until the field attained approximates the desired one in the ROI to a sufficient degree.

7. A method according to claim 1 wherein the desired field is produced by a distribution of magnetic material over one or more flat surfaces.

8. A method according to claim 1 wherein the desired field is produced by a distribution of magnetic material over an elliptical cylindrical shell.

9. A method according to claim 8 wherein the thickness of magnetic material is varied in an azimuthal direction in accordance with the desired field.

10. A method according to claim 1 wherein the desired field is produced by a distribution of magnetic material over the surface of a circular cylindrical shell.

11. A method according to claim 1 wherein the desired field is produced by a combination of paramagnetic and diamagnetic materials.

12. A method according to claim 1 wherein an additional, hypothetical, arbitrary distribution of magnetic material over said surface is incorporated into said set.

13. A method according to claim 1 where the magnetic fields of said set of harmonics are evaluated by an actual step involving numerical integration in real space.

14. A method according to claim 1 where the Fourier transformers of the magnetic fields of said set of harmonics are evaluated directly in Fourier Kernel space.

15. A permanent magnetic structure designed in accordance with the method of claim 1.

16. A method of designing a permanent magnetic structure for generating a desired magnetic field in a region of interest (ROI) on the basis of the minimization of the sum of the least squares of the deviations over the ROI.

* * * * *